United States Patent
Burgold et al.

(10) Patent No.: US 10,611,139 B2
(45) Date of Patent: Apr. 7, 2020

(54) METHOD FOR PRODUCING AT LEAST ONE SPRING CONTACT PIN OR A SPRING CONTACT PIN ARRANGEMENT, AND CORRESPONDING DEVICES

(71) Applicant: FEINMETALL GMBH, Herrenberg (DE)

(72) Inventors: Jörg Burgold, Herrenberg (DE); Christian König, Filderstadt (DE); Wolfgang Schäfer, Grafenberg (DE)

(73) Assignee: FEINMETALL GMBH, Herrenberg (DE)

( * ) Notice: Subject to any disclaimer, the term of this patent is extended or adjusted under 35 U.S.C. 154(b) by 0 days.

(21) Appl. No.: 15/554,445

(22) PCT Filed: Feb. 15, 2016

(86) PCT No.: PCT/EP2016/053183
§ 371 (c)(1),
(2) Date: Aug. 30, 2017

(87) PCT Pub. No.: WO2016/155936
PCT Pub. Date: Oct. 6, 2016

(65) Prior Publication Data
US 2018/0236758 A1    Aug. 23, 2018

(30) Foreign Application Priority Data

Mar. 31, 2015   (DE) .................. 10 2015 004 151

(51) Int. Cl.
*H01R 43/20*    (2006.01)
*B33Y 80/00*    (2015.01)
(Continued)

(52) U.S. Cl.
CPC ............. *B33Y 80/00* (2014.12); *B29C 64/153* (2017.08); *B33Y 10/00* (2014.12); *B33Y 30/00* (2014.12);
(Continued)

(58) Field of Classification Search
CPC ........... C25D 5/54; H01L 24/11; H01L 24/27; B33Y 10/00; B33Y 30/00; Y10S 439/931; Y10T 29/49208
(Continued)

(56) References Cited

U.S. PATENT DOCUMENTS 4,636,026 A    1/1987   Cooney et al.
4,969,842 A    11/1990  Davis
(Continued)

FOREIGN PATENT DOCUMENTS

CA    2887694 A1   6/2014
DE    69025557 T2  7/1996
(Continued)

OTHER PUBLICATIONS

"Dip-in Laser Lithografie", Sep. 19, 2012 (Sep. 19, 2012), pp. 1-1, XP002758114, Retrieved from the Internet: URL:http://www.nanoscribe.de/files/1113/8755/1452/PI_2012_14_Nanoscribe_DiLL_en.pdf [retrieved on May 27, 2016] the whole document.
(Continued)

*Primary Examiner* — Thiem D Phan
(74) *Attorney, Agent, or Firm* — Stephen L. Olson; Harness, Dickey & Pierce, P.L.C.

(57) ABSTRACT

A method for producing at least one spring contact pin acting as an electrical contact, or a spring contact pin arrangement comprises at least one such spring contact pin. The following steps are provided: producing at least one base part of the spring contact pin, at least one section of said base part being made of plastic, and subsequently metallizing at least the
(Continued)

section of the base part that is made of plastic. The invention also relates to a spring contact pin produced to according to said method, or a spring contact pin arrangement having at least one such spring contact pin.

21 Claims, 16 Drawing Sheets

(51) Int. Cl.
| | |
|---|---|
| G01R 1/067 | (2006.01) |
| G01R 3/00 | (2006.01) |
| H01R 13/24 | (2006.01) |
| H01R 43/16 | (2006.01) |
| H01R 13/03 | (2006.01) |
| B33Y 10/00 | (2015.01) |
| B33Y 30/00 | (2015.01) |
| B29C 64/153 | (2017.01) |
| H01R 12/71 | (2011.01) |
| B29C 64/00 | (2017.01) |

(52) U.S. Cl.
CPC ........... *G01R 1/06722* (2013.01); *G01R 3/00* (2013.01); *H01R 12/714* (2013.01); *H01R 13/03* (2013.01); *H01R 13/035* (2013.01); *H01R 13/2407* (2013.01); *H01R 43/16* (2013.01); *B29C 64/00* (2017.08); *Y10T 29/49208* (2015.01)

(58) Field of Classification Search
USPC .................. 29/876, 424, 874, 877, 896.9
See application file for complete search history.

(56) References Cited

U.S. PATENT DOCUMENTS

| | | | |
|---|---|---|---|
| 6,029,344 A | * | 2/2000 | Khandros ............ B23K 20/004 |
| | | | 29/874 |
| 7,094,117 B2 | | 8/2006 | Farnworth et al. |
| 9,755,345 B2 | * | 9/2017 | Rosenberger .......... H01R 43/16 |
| 2007/0069744 A1 | | 3/2007 | Koyagi et al. |
| 2015/0280346 A1 | | 10/2015 | Rosenberger |

FOREIGN PATENT DOCUMENTS

| | | |
|---|---|---|
| DE | 10254524 A1 | 6/2004 |
| DE | 102011102791 A1 | 11/2012 |
| DE | 102012018635 A1 | 3/2014 |
| EP | 0184608 A2 | 6/1986 |
| EP | 0232653 A1 | 8/1987 |
| JP | 2004-356362 A | 12/2004 |

OTHER PUBLICATIONS

International Search Report for PCT/EP2016/053183, ISA/EP, Rijswijk, NL, dated Oct. 4, 2016.
International Preliminary Report on Patentability (Ch. II) with annexes and their translation for PCT/EP2016/05318, IPEA/EP, Rijswijk, NL, dated Mar. 23, 2017.
English Translation of the International Preliminary Report on Patentability for PCT/EP2016/053183, IB, Geneva, dated Oct. 5, 2017.
Office Action issued for the corresponding JP application JP2018527552A.

* cited by examiner

Fig. 10
Fig. 11
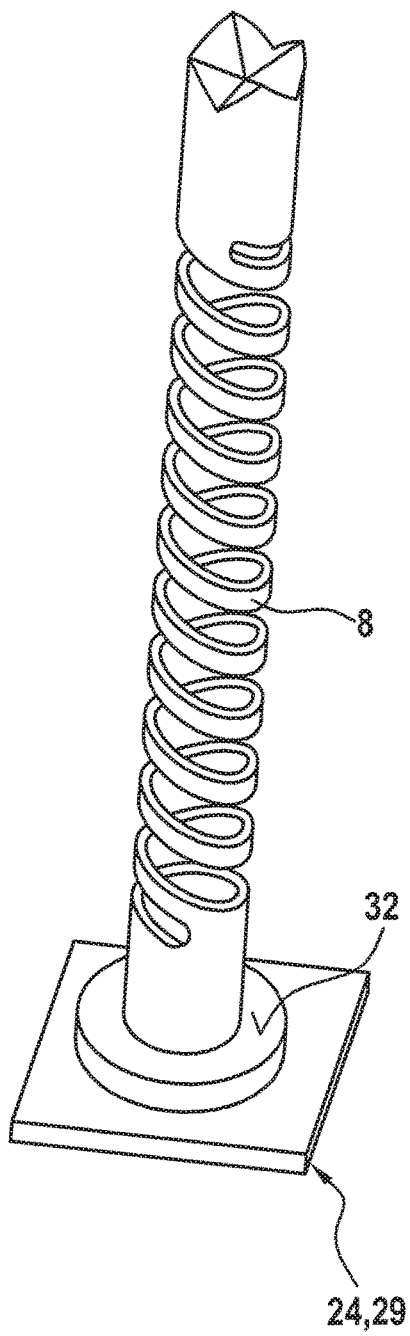
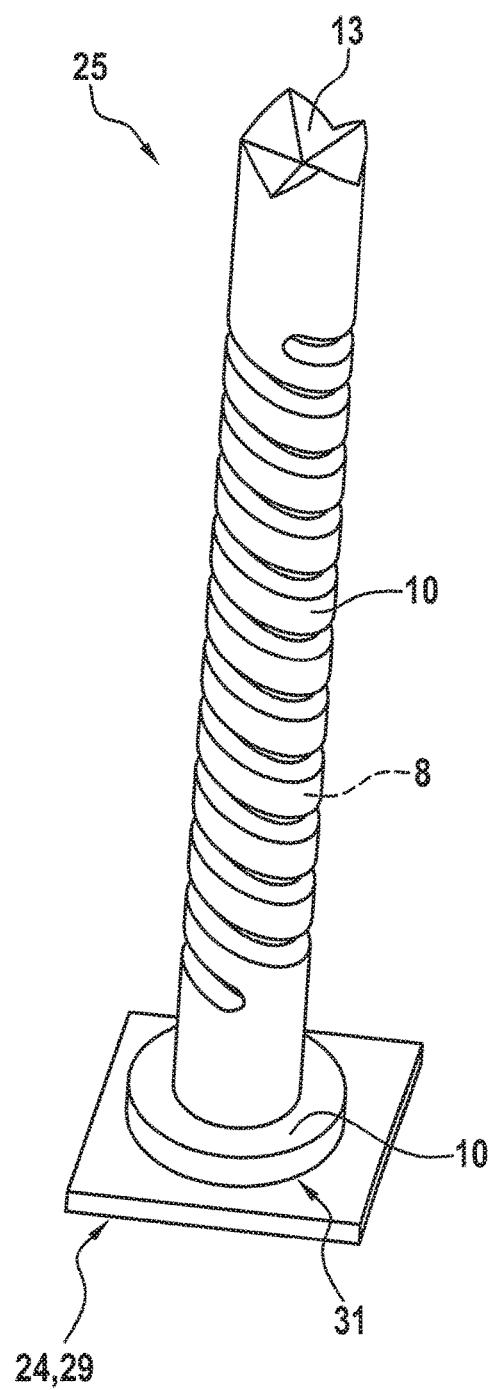

METHOD FOR PRODUCING AT LEAST ONE SPRING CONTACT PIN OR A SPRING CONTACT PIN ARRANGEMENT, AND CORRESPONDING DEVICES

CROSS-REFERENCE TO RELATED APPLICATIONS

This application is a 371 U.S. National Stage of International Application No. PCT/EP2016/053183, filed Feb. 15, 2016. This application claims the benefit of and priority to German Patent Application No. 10 2015 004 151.7, filed Mar. 31, 2015. The entire disclosures of the above applications are incorporated herein by reference.

FIELD

The invention relates to a method for producing at least one spring contact pin acting as an electrical contact, or a spring contact pin arrangement comprising at least one such spring contact pin.

BACKGROUND

For the previous known manufacture of spring contact pins, the individual components such as piston, spring, head, jacket, etc. were manufactured by means of machining or forming techniques, such as lathing, milling, deep-drawing, forging, etc. After completion of the individual components, they are assembled. The diameter of such a known spring contact pin determines the so-called contact spacing (center-to-center distance to an adjacent pin), wherein the contact spacing is predetermined by the test object, i.e. from an electric component which is electrically contacted by means of the spring contact pins to create test circuits which allow for an evaluation of the functionality of the test object. Currently, spring contact pins with a minimum diameter of approximately 0.1 mm with the aforementioned classic structure are known, wherein such small diameters cannot be produced economically at high quality with the classic manufacturing technique. Key reasons are the great requirements on the tolerances during the manufacture of the individual components and the subsequent assembly of the individual components to a complete spring contact pin, which can only be accomplished manually.

The problem addressed by the invention is that of being able to manufacture a spring contact pin of the initially described type which allows for a very small contact spacing, which can be produced cost-efficiently, has a high quality, and is functionally reliable. This problem also applies to a spring contact pin arrangement comprising at least one spring contact pin.

SUMMARY

According to the invention—taking into account the initially described method—this problem is solved by the following method steps: Producing at least one base part of the spring contact pin, wherein at least one section of the base part is made of plastic, and subsequent metallizing of at least the section of the base part that is made of plastic. The metallizing creates a metallic coating/metal sleeve which has an electric conductivity, preferably a good electric conductivity. With the metallizing according to the invention of at least a section of the base part, it is possible to create a miniaturized spring contact pin which requires only a few or no assembly steps for the components at all. The base part preferably forms the basic structure of the spring contact pin, wherein it is made at least to some extent of plastic. In order to be able to provide the contact to be executed with the spring contact pin for electrically testing an electric test object, electric conductivity of the spring contact pin is required. Electric conductivity is created by the metallizing of at least the section of the base part that is made of plastic. Due to the use of plastic, even complex structures can be produced easily and cost-effectively. After the metallizing of the plastic, complex electrically conducting structures are created which cannot at all be produced in accordance with conventional manufacturing techniques or only at extremely high costs and also not as the miniaturization made possible by the invention. Good electric and mechanical properties of the spring contact pin are achieved with metallizing. The plastic part, particularly the plastic base part allows for the realization of very delicate structures which, however, have no sufficient electric or mechanical properties, but these properties are provided in sufficient, even good quality by metallizing.

According to a development of the invention, the at least one section of the base part which is made of plastic is produced by means of an additive manufacturing process. "Additive manufacturing process," which is also called "generative manufacturing process," refers to a particularly quick and cost-effective manufacture which is executed directly on the basis of computer-internal data models from a shapeless (for example liquids, powders or the like) or a shape-neutral (for example, ribbon-like, wire-shaped, etc.) material by means of chemical and/or physical processes. Even though these are forming processes, no special tools, in which the corresponding geometry of the workpiece is stored (for example, molds), are required for a concrete result.

Preferably, a two-photon laser lithography, particularly a dip-in laser lithography method (DILL technology) is used as additive manufacturing process. Preferably, a liquid, particularly paste-like material is used and solidified by means of a laser. The material is preferably structured layer by layer, and so the section made of plastic is thus manufactured. This additive manufacturing process allows for extremely great design flexibility for different geometries, and so very complex plastic structures can be realized. With DILL technology, structures in the submicrometer range can be produced; as a result, spring contact pins according to the invention for a contact spacing of 0.3 mm or even smaller can be produced. Due to the technology according to the invention, the production of test cards with grids below 80 µm is also possible. For this technology, no special tools for the construction of the components are required.

Metallizing takes place preferably by means of at least one galvanic and/or chemical process. A galvanic process is characterized by the use of electric current; the process of chemical precipitation is also called "electroless metal precipitation." In each case, there is a metal build-up on the aforementioned plastic geometry. Preferably, a metal layer is precipitated by the galvanic or chemical process. Metals such as copper, silver, gold, and nickel are particularly suitable.

According to a development of the invention, the entire base part is made of plastic, preferably by means of the additive manufacturing process, particularly as a one-piece base part. Such components can combine different functions, even if they are designed as a one-piece component. For the spring contact pin, the head used as contact is thus preferably attached directly to an elastic area. Due to the great design flexibility, the spring can be designed by the additive manufacturing process such that it does not have to be supported, i.e. it does not require an additional jacket or the like. As a result, no assembly of components is required. A one-piece base part that combines all the functions of a spring contact pin is made of plastic with the additive manufacturing process and subsequently metallized, and so a preferably miniaturized spring contact pin for contact spacings of less than 0.1 mm is thus produced in a simple manner. Preferably, the entire base part is metallized, and so covering steps, such as masking or the like are not required.

According to a development of the invention, prior to the galvanic metallizing, an electrically conducting starting layer is applied at least to the section of the base part which is made of plastic or is produced on the surface of the section. If a plastic is used that is not or not sufficiently conductive, an electrically conducting starting layer is required for the galvanic precipitation in order to ensure an electric current flow during the galvanization process. However, alternatively, an electrically conducting plastic or an electrically conductively equipped plastic composite can also be used from the start for producing the base part.

Preferably, prior to the particularly chemical metallizing, a seed layer is applied, particularly by means of the dipping or plasma process, at least to the section of the base part which is made of plastic, or is produced on the surface of the section. "Seeds" and/or "attachment points" are thus created on the surface of the corresponding plastic geometry, and the metallizing can take place.

Preferably, after metallizing, the section made of plastic is not removed, or at least areas thereof are removed, particularly by means of a pyrolysis method, a wet chemical process and/or a dry chemical process. After metallizing, it is of course possible for the plastic core, i.e. the section of the base part or the entire base part, to remain in the metal sleeve. Alternatively—as mentioned above, it is possible to remove said plastic core from the metal sleeve by means of a suitable selective method. For that purpose, the aforementioned pyrolysis method, the wet chemical process and/or the dry chemical process are suitable.

Particularly, at least one opening is created or left in the metal sleeve formed by metallizing, said opening being used for pyrolysis products to escape and/or for providing access of at least one wet chemical and/or dry chemical agent for executing the wet chemical and/or dry chemical process. As a result, the appropriate residual products can escape and/or accessibility to the plastic material to be removed is created.

According to a development of the invention it is provided that for the spring function of the spring contact pin, at least one area of the spring contact pin is designed elastically resilient due to inherent elasticity and/or the design of its material. The spring contact pin according to the invention thus has preferably no separate spring component for generating the spring function, but instead an area of the spring contact pin assumes this function in that the inherent elasticity and/or the design of the material of this area generate the spring properties.

Particularly, the elastic area is integral with the remaining section of the spring contact pin, i.e. it is a one-piece spring contact pin, with one area of it acting elastically. A "one-piece spring contact pin" shall also refer to a spring contact pin that consists of a component formed by metallizing, regardless of whether the plastic core is still in the metal sleeve or whether the plastic core was removed or at least partially removed.

Preferably, the elastic area can be produced by forming at least one pressure, tension, bending and/or torsion spring and/or as a resilient area according to the buckling-wire principle. Said spring is preferably integral with the remaining section of the spring contact pin. The "buckling-wire principle" provides that the spring contact pin laterally rebounds under pressure along its longitudinal extension when contacting the test object.

According to a development of the invention, at least one head for contacting is formed on the end of the spring contact pin, said head having preferably at least one sharp tip and/or sharp edge for contacting. Preferably, such a head is provided on each end of the spring contact pin. Said sharp tip and/or edge is preferably created by the plastic base part and made electrically conducting and sufficiently stable by the subsequent metallizing.

The arrangements described in this patent application, which not only comprise one or more spring contact pins but also additional parts, shall each be denoted as "spring contact pin arrangement having at least one spring contact pin."

According to a development of the invention, the spring contact pin is provided with at least one removable, particularly detachable connecting part. This connecting part is used particularly for handling/manipulating the spring contact pin in order to be able to handle it better during an installation, for example, for inserting it in a test adapter. Once the handling is completed, the connecting part is preferably removed, e.g. detached which, for example, can be facilitated by a predetermined breaking point or effected by a further process step. For example, such a process step can be a laser separation process or a focusing, ion beam-based separation process.

According to a development of the invention, a plurality of spring contact pins—particularly in a two or three-dimensional grid—can be produced connectedly by means of the at least one connecting part. As a result, these spring contact pins are thus, for example, already arranged in the desired contact spacing and can particularly be handled as a common unit, wherein they can be handled not only manually but also mechanically or in a combination of manual and mechanical handling.

A development of the invention provides that the connecting part is configured as connecting web or connecting plate, particularly a guide plate. If the spring contact pin comprises the connecting web, it can be handled by means of said connecting web, for example, during the metallizing process and/or for an improved packaging and/or during installation, e.g. in a test adapter. If the connecting web connects a plurality of spring contact pins, the group of spring contact pins can thus be handled very well. In case of a connecting plate, a plurality of spring contact pins can be arranged three-dimensionally, i.e. they are held by the plate in a three-dimensional grid and thus connectedly very good to handle as a group. If the connecting part is a guide plate, it can be provided with guide bores which are penetrated by spring contact pins. For handling, at least sections of the spring contact pins are connected to the bore walls. Each of these connections can subsequently be removed, and so the guide bores are used for axially guiding the spring contact pins when making contact. Particularly, a plurality of such guide plates can be provided, particularly two guide plates which are spaced apart from one another and thus optimally hold, position, and guide the spring contact pins.

In particular, the connecting part is produced or jointly produced by means of the additive manufacturing process. However, alternatively, it is also possible that the connecting part is introduced as a prefabricated additional part, i.e. it is added as a prefabricated component to the additive manufacturing process for producing the at least one spring contact pin.

In a development of the invention, the connecting part is an electric circuit carrier, particularly a circuit board. The circuit carrier, particularly the circuit board, can comprise electric/electronic means, and so the at least one spring contact pin is placed in an electric/electronic circuit arrangement.

According to a development of the invention, the at least one spring contact pin is produced on an electric contact surface of the connecting part. The connecting part and the electric contact surface are used for contacting, i.e. the spring contact pin is produced on a component that is furthermore used, when the spring contact pin is subsequently used to electrically test a test object.

Particularly, the electric contact surface can also be metallized. Thus, not only the base part but also the electric contact surface of the connecting part is metallized, particularly jointly metallized.

It is further advantageous if a pedestal component made of electrically conducting material, preferably metal, is produced on/attached to the contact surface of the connecting part, and that the spring contact pin is produced on the pedestal component, wherein metallizing is extended to an area of the pedestal component adjacent to the base part but is not extended to the contact surface. The pedestal component prevents that a metallic coating during metallizing extends to the connecting part, for example a connecting plate, particularly a guide plate, thus causing electrical shorts between adjacent spring contact pins. Since the metallizing extends to the pedestal component but not so far as to come very close to the contact surface, such an electrical short is prevented.

Advantageously, the pedestal component is produced by means of the additive manufacturing process, particularly by sintering, preferably laser sintering, of powder materials. Preferably, the pedestal component can be produced on the contact surface and particularly electrically connected to said contact surface. As a result of producing the pedestal component by sintering, an electric connection to the contact surface is preferably created when producing the pedestal component, thus simultaneously also creating an appropriate section of the corresponding test current path for the electric contact used for testing the test object.

It is further advantageous if the pedestal component is produced with at least one elastic structure, particularly an elastic area of the particularly one-piece pedestal component such that the spring effect acts in the direction of the contact. The pedestal component thus acts elastically when contacted, thus being supplemented by the spring effect of the spring contact pin. Particularly, the spring structures of the pedestal component and the spring contact pin have different spring constants. It is also conceivable to design the spring contact pin, due to the elastic area of the pedestal component, merely as axial short structure, substantially only in the form of an elastic contact head.

Lastly, the invention relates to a spring contact pin or a spring contact pin arrangement having at least one spring contact pin, each produced according to a method as described above in the different embodiments.

Further embodiments and/or advantages of the invention follow from the claims, particularly the dependent claims.

BRIEF DESCRIPTION OF THE DRAWINGS

The drawings illustrate the invention using embodiments.

FIG. 10 shows a further embodiment of a spring contact pin with a connecting part having a contact surface in a not yet metallized state;

FIG. 11 shows the arrangement of FIG. 10 in the metallized state;

DETAILED DESCRIPTION

Figure 1:
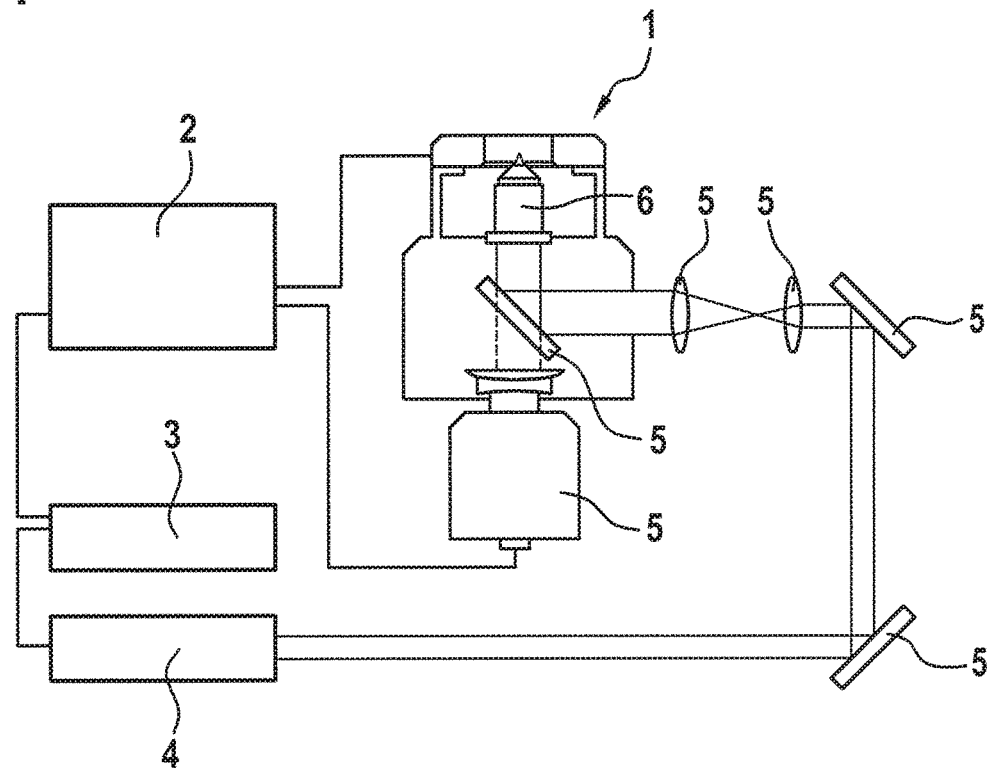
FIG. 1 shows a schematic structure of a 3D laser lithography device for producing at least one part of a spring contact pin or a spring contact pin arrangement.

According to FIG. 1, an additive manufacturing process is used for producing at least one spring contact pin acting as an electric contact, or spring contact pin arrangement comprising at least one such spring contact pin. The additive manufacturing process preferably uses a dip-in laser lithography (DILL) technology which, according to FIG. 1, comprises a workpiece holding arrangement 1, a computer 2, a laser control device 3, a laser 4, a laser beam deflection/laser beam focusing and laser beam influencing device 5, and a lens system 6. A material, particularly in the form of a liquid or a paste-like mass, associated with the workpiece holding arrangement 1, is—controlled by the computer 2 and said laser arrangement—cured, resulting in the workpiece. The curing is effected layer by layer, i.e. the workpiece is gradually constructed, wherein there is extremely great design flexibility for highly diverse geometries. In the present case, a material is used which allows for the production of a base part 8 made of plastic. The base part 8 (FIG. 3) preferably forms a basic structure of a spring contact pin 9. The spring contact pin 9 of FIGS. 3 and 4 shall be described in more detail below.

Figure 2:
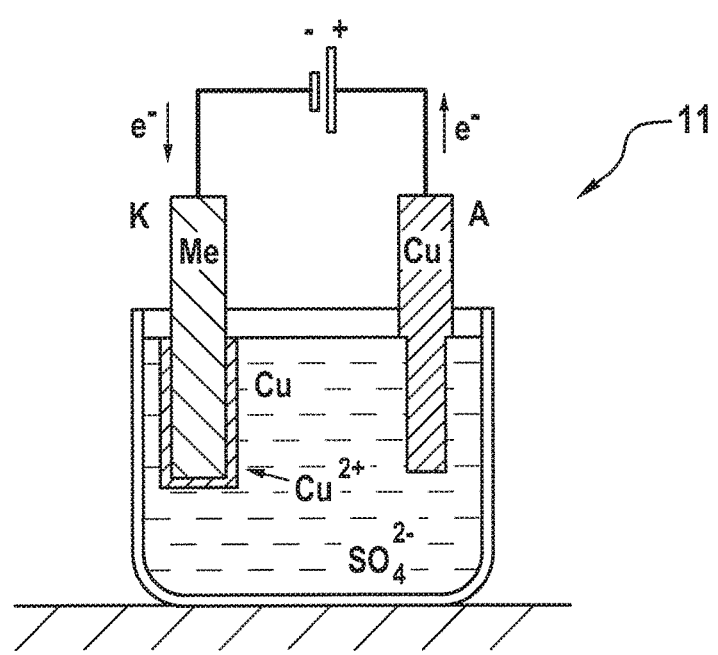
FIG. 2 shows a schematic structure of a galvanic equipment for metallizing of at least one part of the spring contact pin or a spring contact pin arrangement.
Figure 3:
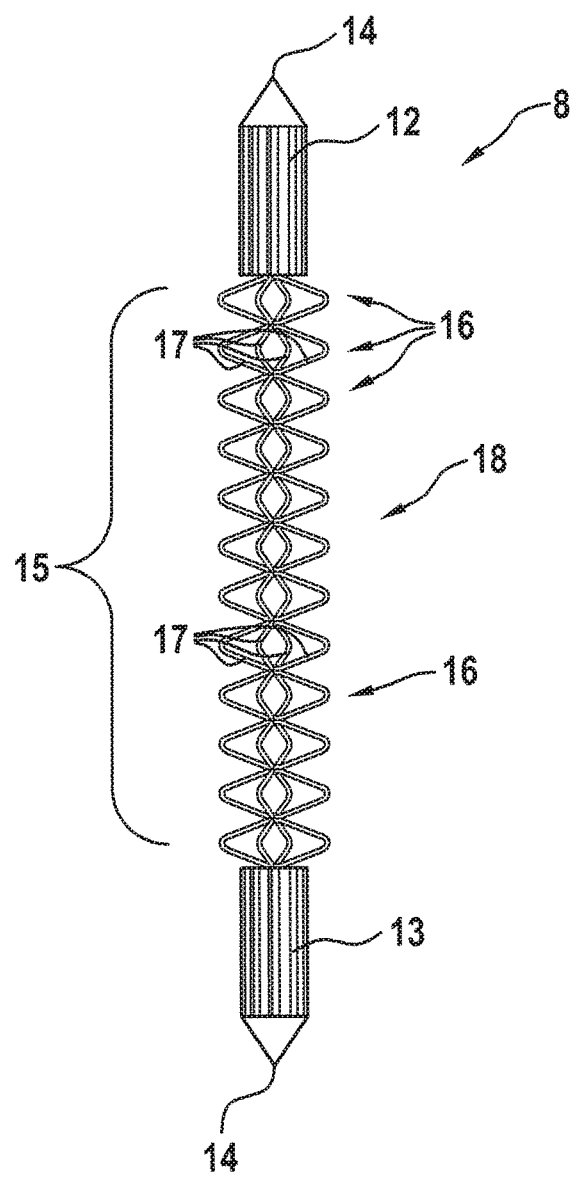
FIG. 3 shows a base part made of plastic for a spring contact pin.

Once the base part 8 according to FIG. 3 is constructed by means of the arrangement of FIG. 1, the base part 8 is metallized in a subsequent step, i.e. the plastic of the base part 8 is provided with a metallic coating. This, for example, is accomplished with a galvanic process. The embodiment in FIG. 2 shows a galvanic equipment 11, in which copper is precipitated in a liquid bath from an anode A to a cathode K, i.e. cathode K receives a coating of copper. If the base part 8 is used as cathode, it will be coated with a metallic coating 10 made of copper. Of course it is possible to also use other materials, particularly also silver, gold, and nickel, and naturally also further advantageous electrically conducting metals. In order to be able to galvanically metallize the plastic base part 8 in the galvanic equipment 11, an electric conductivity of the plastic is required, which is provided by means of an electrically conducting starting layer. This starting layer is applied to the base part 8 and, due to its electric conductivity allows for the precipitation of the metallic coating 10. Such starting layers are basically known.

Figure 4:
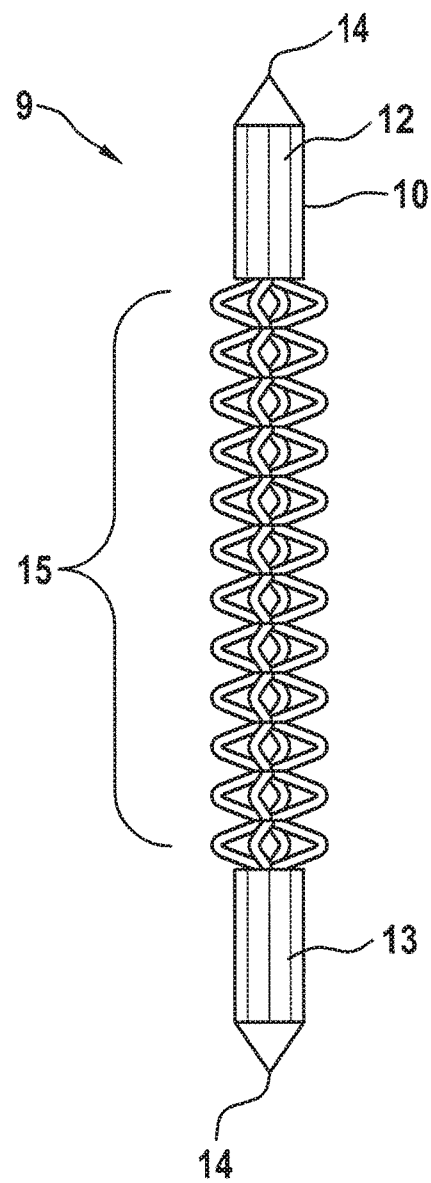
FIG. 4 shows a spring contact pin, comprising the base part of FIG. 3 which was metallized.

FIGS. 3 and 4 illustrate the manufacturing process of the spring contact pin 9. Regardless of the concrete design of the spring contact pin 9, the base part 8 of FIG. 3 is produced particularly by means of said additive manufacturing process. On each end, it comprises a head 12, 13, each preferably with a sharp tip 14, as well as an area 15 which is configured as elastic area 15, particularly with regard to its design. The base part 8 is designed as one piece, i.e. the two heads 12 and 13 and the elastic area 15 consists of one piece of continuous plastic. The elastic area 15 is composed of individual disc spring-like spring elements 16, which are connected as one piece, each comprising a plurality of arch-shaped arms 17. Overall, the elastic area 15 forms a pressure spring 18 acting in axial direction.

A comparison of FIGS. 3 and 4 shows that the basic structure of the plastic part of FIG. 3 is basically maintained after the metallic coating 10 is applied to the base part 8. The resulting corresponding electric as well as mechanical properties of the completed spring contact pin 9 from FIG. 4 depend on the electrically conducting metal used. It is particularly provided that the metallic coating 10 is formed on the surface of the plastic base part 8 because this is where the greatest tensions under mechanical stress can be expected. The spring contact pin 9 of FIG. 4 can comprise a plastic base part 8 of FIG. 3 with only a very small volume (for example, 5.19E-04 $mm^3$ at a height of 2 mm and a maximum diameter of 0.3 mm). The completed metallically coated spring contact pin 9 of FIG. 4 is preferably provided with a layer thickness of 0.01 mm of metallic coating 10.

After metallizing, there are two options. The plastic core (base part 8) remains in the metal sleeve (metallic coating 10), or the plastic core is removed from the metal sleeve by means of a suitable method, for example, by means of pyrolysis, a wet chemical process, or a dry chemical process. Particularly preferred, the metallic coating 10 comprises for that purpose at least one opening, and so the pyrolysis product can escape and/or the wet chemical or dry chemical agents can affect the plastic core.

Figure 5:
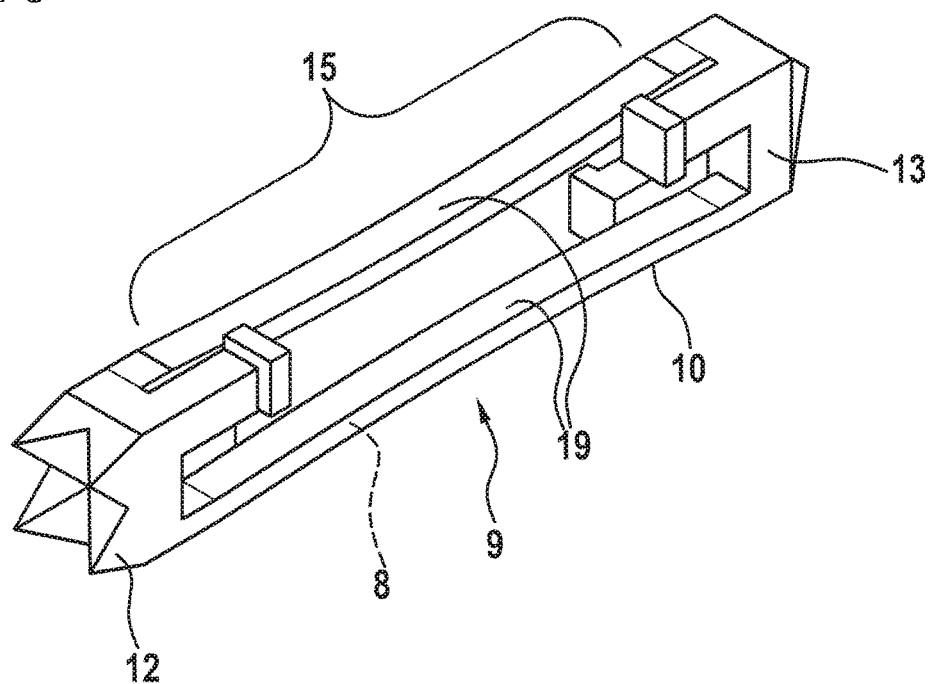
FIG. 5 shows a further embodiment of a spring contact pin in a not contacted state.
Figure 6:
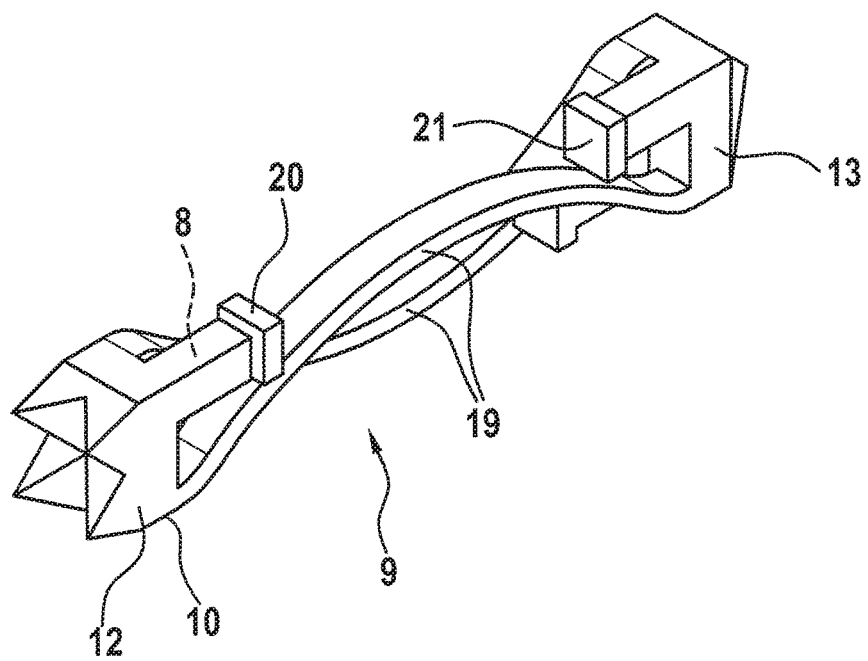
FIG. 6 shows the spring contact pin of FIG. 5 in the contacted state.

FIG. 5 shows a further embodiment of a spring contact pin 9 which was produced using the method according to the invention. Two slightly bent articulated webs 19 lie—as elastic area 15—between the heads 12 and 13, which buckle laterally (buckling-wire principle) during contact, i.e. a test process, during which an electric test object is tested for functionality and for that purpose is electrically contacted by means of the at least one spring contact pin 9. In order to delimit this lateral buckling, stops 20, 21 according to FIG. 6 extend from the heads 12 and 13, against which the articulated webs 19 push in case of correspondingly great axial stress of the spring contact pin 9.

Figure 7:
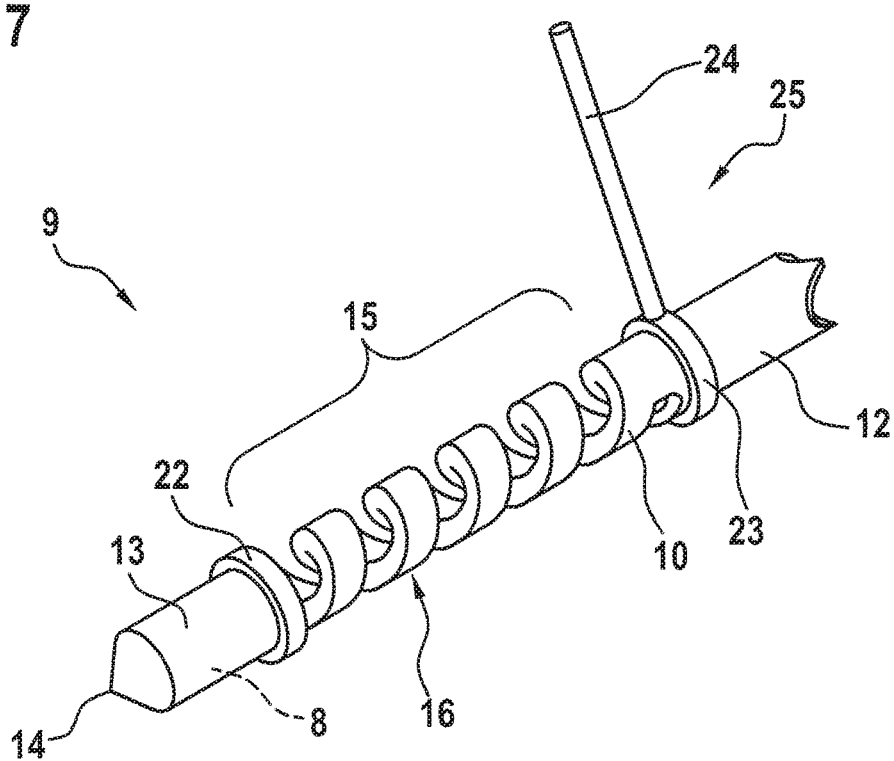
FIG. 7 shows an embodiment of a spring contact pin which is provided with a preferably removable connecting part for handling.

FIG. 7 shows a further embodiment of a spring contact pin 9 which was also produced using the method according to the invention, thus having a plastic base part 8 which was provided with a metallic coating 10. Between the two heads 12 and 13 of the spring contact pin 9 lies the elastic area 15 which in the present case is designed as spiral pressure spring. Similar to the previous embodiments, the spring contact pin 9 is designed as one piece, wherein this definition shall apply regardless of whether it still contains the plastic core or not. In order to delimit the axial spring deflection, annularly designed stops 22, 23 can each be provided on the end of the elastic area 15. In a state of the spring contact pin 9, in which it is installed in a test adapter or the like, the stops 22 and 23 interact with corresponding guide plates of the test adapter. The spring contact pin 9 penetrates bores of the guide plates, wherein the stops 22 and 23 are located between the guide plates. The arrangement is selected such that the spring contact pin 9 in its installed state and due to the support of the stops 22 and 23 is slightly preloaded, i.e. axially compressed at the guide plates. The embodiment of FIG. 7 is provided with the particularity that the spring contact pin 9 is provided with a removable connecting part 24. In this case, the connecting part 24 is designed as connecting web. The connecting part 24 is preferably produced as part of the aforementioned additive manufacturing process, i.e. during the production of the base part 8, or is added to the process as completed additional part and connected to the base part 8, or it is produced during a separate further manufacturing process, particularly attached to the base part 8, wherein this further additive manufacturing process is preferably a sintering process, particularly a laser sintering process, for which powder materials are used and cured by sintering, particularly laser sintering, thus creating the connecting part 24. For the metallizing, it can be provided that the connecting part 24 is either not metallized or is also metallized. The connecting part 24 is used particularly for easier handling of the spring contact pin 9, particularly for easier handling of the base part 8 for the metallizing process and/or the subsequent use of the completed spring contact pin 9, for example, to be able to easily introduce it in a test adapter. It is particularly provided that in the embodiment of FIG. 7, the connecting part 24 is removed after completion of the corresponding handling, for example, by breaking, preferably at a predetermined breaking point or by laser separation, etc. The embodiment of FIG. 7 shows overall a spring contact pin arrangement 25, namely a spring contact pin 9 and the connecting part 24 arranged on such a spring contact pin 9.

Figure 8:
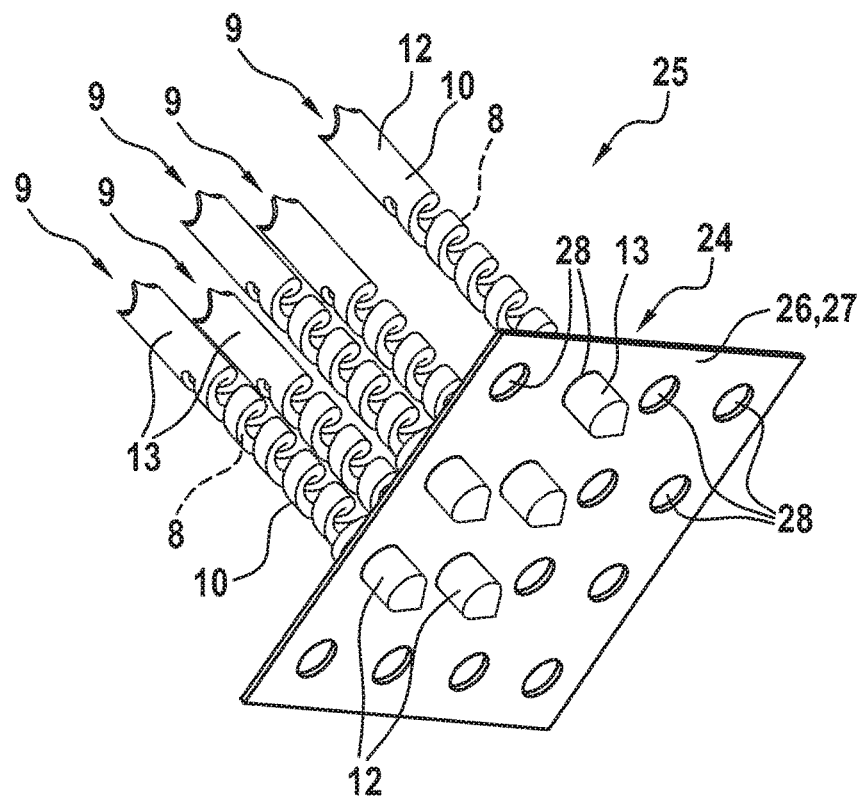
FIG. 8 shows a plurality of spring contact pins which are connected to a connecting part designed as a guide plate.

FIG. 8 shows a further spring contact pin arrangement 25, namely a connecting part 24 with a plurality of spring contact pins 9 arranged on such a connecting part 24. The spring contact pins 9 are produced according to the invention. The connecting part 24 is configured as a connecting plate 26, particularly as a guide plate 27. The guide plate 27 can be produced by means of the additive manufacturing process—similar to the base part 8 of the spring contact pins 9, or be introduced as completed additional part, or as a part produced with a further additive manufacturing process. According to FIG. 8, the guide plate 27 comprises guide holes 28 arranged in a grid, particularly a two-dimensional grid, at least some of said guide holes 28 being penetrated by spring contact pins 9, particularly in the area of one of their heads 12, 13. The function of the guide plate 27 is that of receiving the individual spring contact pins 9 and aligning them to the desired grid and design, particularly that of the test adapter. The spring contact pins 9 are guided axially in the guide holes 29, i.e. held in position, and only the movement of axial deflection, particularly the axial deflection of one or both heads 12, 13 is possible. The connecting part 24, i.e. particularly the guide plate 27 can be—as mentioned before—produced by means of the additive process, with which the spring contact pins 9 are also produced. However, since the connecting part 24 is a relatively large structure and has a correspondingly large volume, it is preferred to add this component as insert component to the additive process. The spring contact pins 9 are then built directly on surfaces of the connecting part 24, particularly within the guide holes 28. If electric and/or mechanical connections are created during this process between the spring contact pins 9 and the connecting part 24, they can subsequently be severed again. Due to the guide plate 27, it is possible to produce the spring contact pins 9 directly in the correct alignment for the subsequent test application. It is further advantageous that even the installation of the spring contact pins 9 in the connecting part 24, particularly the guide plate 27 is omitted. If the plastic base parts 8 of the spring contact pins 9 are produced on the connecting part 24 during their production, it must be ensured during the subsequent metallizing that only the individual base parts 8 receive a metallic coating 10 but not the connecting part 24 in order to avoid electrical shorts. For that purpose, it is, e.g. possible to construct or introduce a connecting part 24 from a material which, contrary to the plastic of the base parts 8, cannot be galvanically or chemically metallically coated. For example, ceramic can be used as material for the connecting part 24. It is also conceivable that a possible metallic coating 10 of the connecting part 24 is again removed by a downstream process. This can be achieved by a subsequent laser process which removes the metallic coating 10 in the area of the connecting part 24. It is also conceivable to use masking processes which are executed particularly prior to the process of applying the starting layer in the galvanic process or a seeding in a chemical process. The metallic coating 10 would then possibly also take place on the masking. The metallic coating 10, together with the masking, would then be removed by means of a so-called lift-off process.

Figure 9:
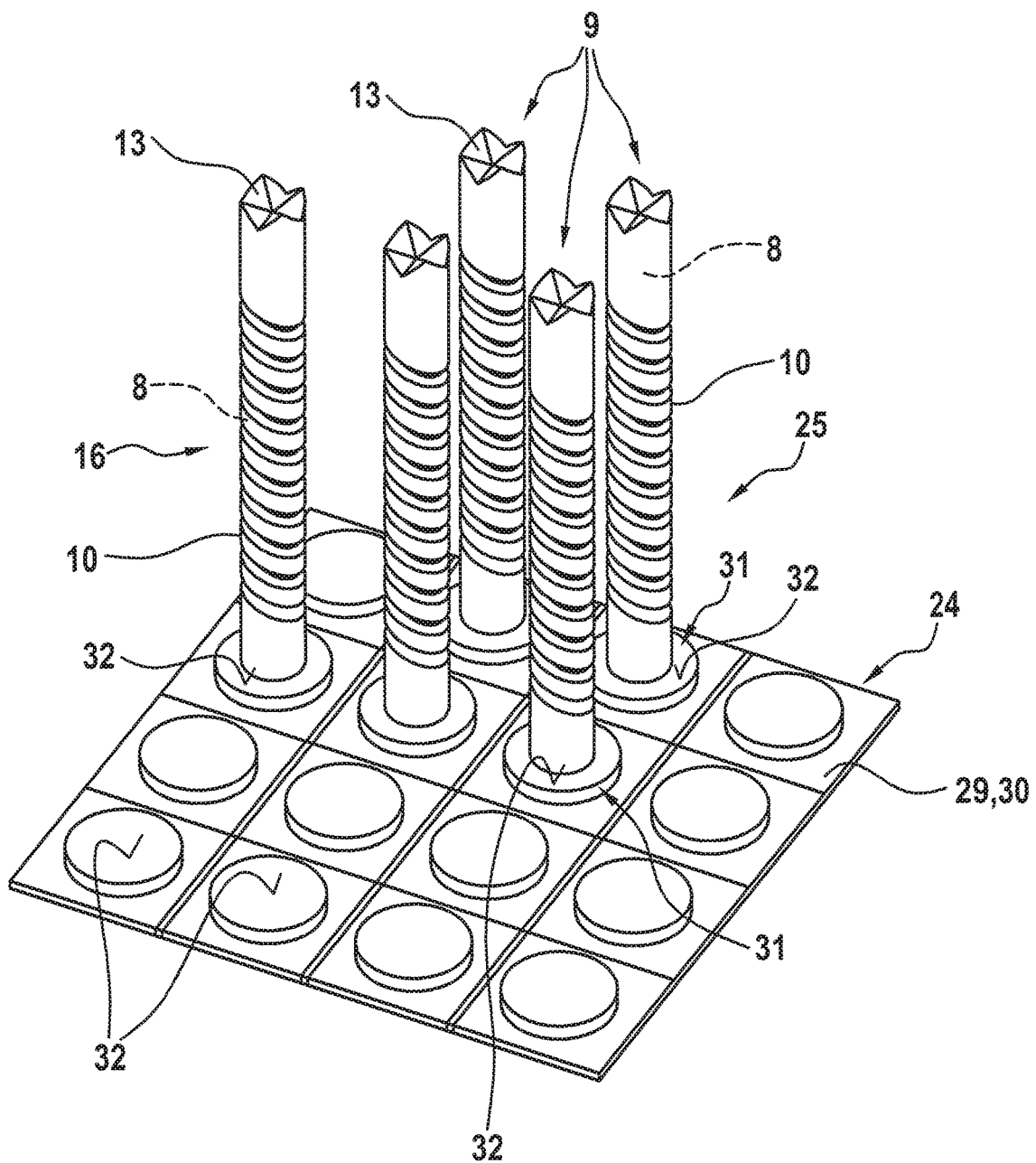
FIG. 9 shows a plurality of spring contact pins which are connected electrically conductively to electrically conductive contact surfaces (contact pads) of a connecting part, wherein the connecting part is designed as an electric circuit carrier, particularly as a circuit board.

FIG. 9 shows a further embodiment of a spring contact pin arrangement 25 with a plurality of spring contact pins 9 which were produced using the method according to the invention. The spring contact pin arrangement 25 further comprises a connecting part 24 which is designed as an electric circuit carrier 29, particularly a circuit board 30. Contrary to the embodiment of FIG. 8, the connecting part 24 of FIG. 9 not only has a mechanical but also an electric function (in the embodiment of FIG. 8, this is a purely mechanical function, namely an alignment, holding, and guide function). In the embodiment of FIG. 9, an electric interface 31 is realized at each of the spring contact pins 9. The interface 31 is an additional component that mechanically secures the corresponding spring contact pin 9 on the connecting part 24 and provides its individual electrical contact. Preferably, the spring contact pins 9, by means of the method according to the invention, are additively built directly onto electric contact surfaces 32 located on the electric circuit carrier 29. During metallizing of the base part 8 of the spring contact pins 9, an electric connection between the metallic coating 10 and the electric contact surface 32 is created, resulting in a non-detachable electric connection between the corresponding spring contact pin 9 and the electric circuit carrier 29. However, this electric connection does naturally not exist between the individual electric contact surfaces 32 because this would lead to electrical shorts. This system design also shows that installation and adjustment of individual spring contact pins on a circuit carrier according to the prior art is omitted. Due to the invention, a highly integrated, simple solution is present. Contact with a test object is effected particularly by feeding the ends of the spring contact pins 9 which are not connected to the electric circuit carrier 29 to corresponding contacts of the electric test object to be tested. As already mentioned for the embodiment of FIG. 8, the connecting part 24 of FIG. 9 can also be realized in three different ways; either it is built when the spring contact pins 9 are produced during the additive manufacturing process, or it is introduced as additional part, or it is produced by means of a different additive manufacturing process, particularly a sintering of powder materials. The electric contact surfaces 32, which consist of conducting material, particularly metal, can thereby be introduced as completed parts or realized by corresponding metallic coating of the surface of the connecting part 24.

Figure 12:
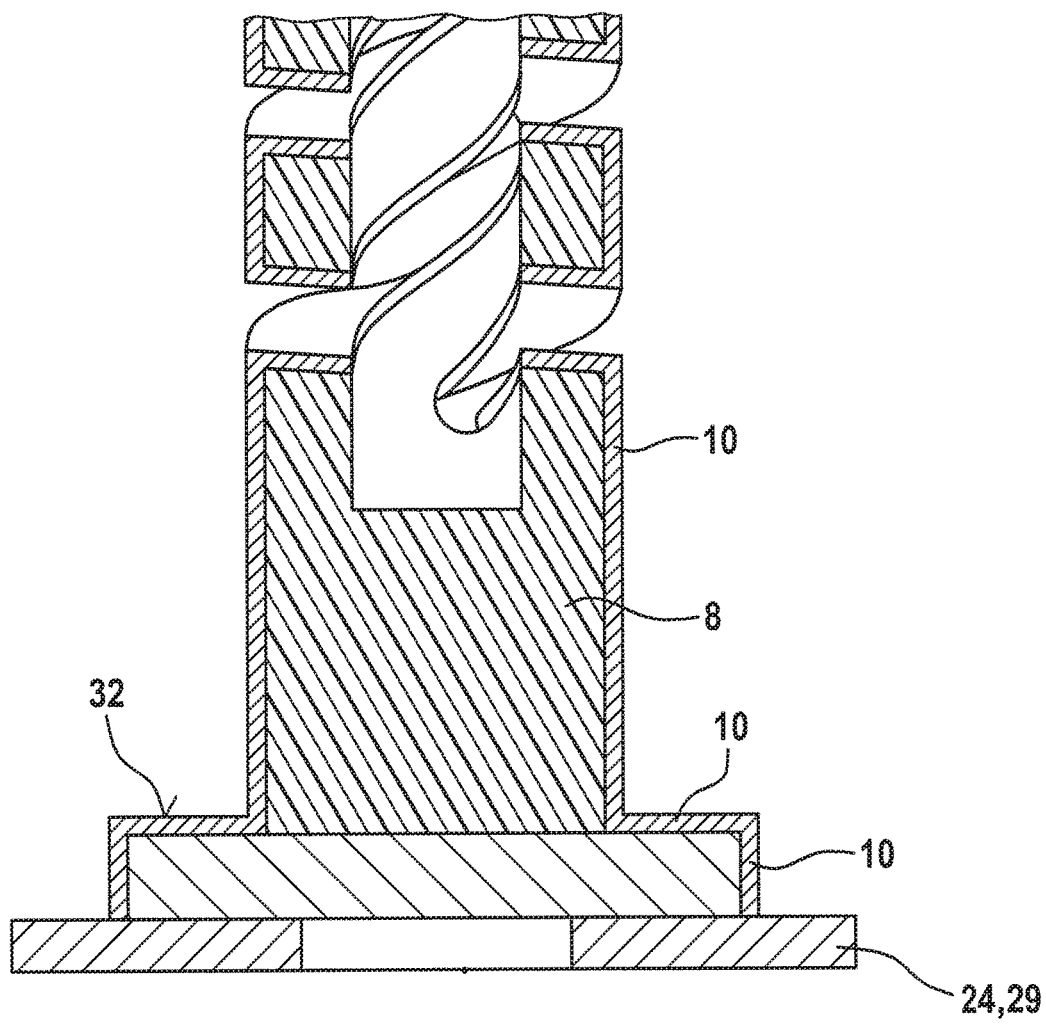
FIG. 12 shows a longitudinal section view through the lower area of the arrangement of FIG. 11.

The above embodiments are once more illustrated by FIGS. 10 to 12. FIG. 10 shows that the plastic base part 8 of a spring contact pin 9 is produced on an electric contact surface 32 of a connecting part 24 using the method according to the invention. According to FIG. 11, subsequent metallizing takes place, wherein the metallic coating 10 is applied to the base part 8 and also to the electric contact surface 32, but not to the surface of the connecting part 24. Optionally, the plastic base part 8 can subsequently—as described—be removed. Alternatively, the base part 8 is retained in the interior of the spring contact pin 9. FIG. 12 illustrates with its sectional view that the metallic coating 10 is produced not only on the base part 8 but on the contact surface 32. The metallic coating 10 is realized as one piece.

Figure 13:
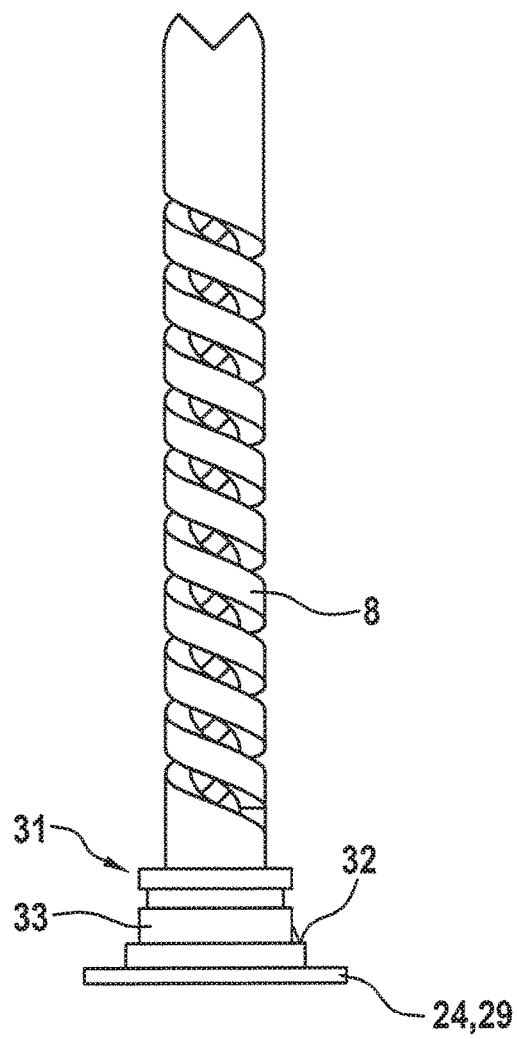
FIG. 13 shows a further embodiment of a spring contact pin with a connecting part having a contact surface, wherein a pedestal component is arranged between the contact surface and the spring contact pin, overall in an not yet metallized state.
Figure 14:
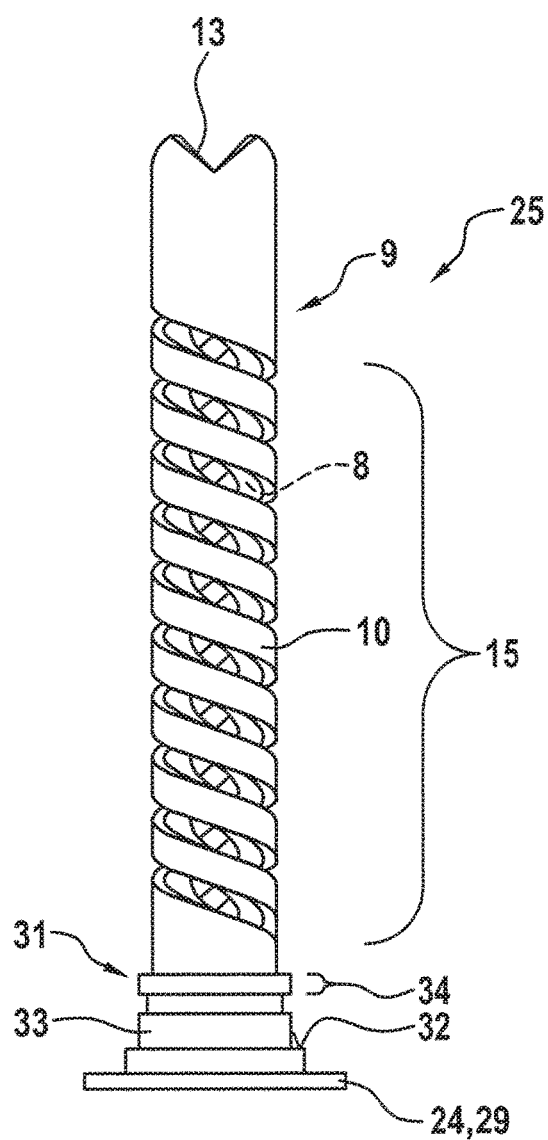
FIG. 14 shows the arrangement of FIG. 13 in its metallized state.

FIG. 13 shows an embodiment of the invention which corresponds to the embodiment of FIG. 10, but wherein a pedestal component 33, particularly made of electrically conducting material is arranged/produced between the electric contact surface 32 and the base part 8. For the embodiment of FIGS. 13 and 14, reference is herewith made to the descriptions for FIGS. 9 to 12, wherein in the following, only the differences in the embodiment of FIGS. 13 and 14 shall be described. The pedestal component 33 located on the contact surface 32 can be introduced as additional part to the process according to the invention, or it is produced by means of the additive manufacturing process, with which the base part 8 is also produced, wherein, however, different materials are used, since the base part 8 consists of particularly electrically non-conducting plastic, and the pedestal component 33 preferably consist of electrically conducting material. It is further possible that the pedestal component 33 is produced by means of the aforementioned further additive manufacturing process, particularly by sintering of at least one powder material. The additive manufacturing steps take place preferably directly on the electric circuit carrier 29, particularly on its electric contact surface 32. Once the pedestal component 33 is produced, particularly by means of the additive manufacturing process, the base part 8 of the spring contact pin 9 is produced on the pedestal component 33. Subsequently, the metallic coating 10 is applied, wherein the base part 8 is coated, and the metallic coating 10 is also applied to an area 34 adjacent to the base part 8, but does not continue in the direction of the connecting part 24, particularly not on the contact surface 32. It is thus prevented that electric shorts occur between the individual spring contact pins 9. Since the pedestal component 33 consists of electrically conducting material, an electric path from the metallic coating 10 of the spring contact pin 9 to the pedestal component 33 and from there to the electric contact surface 32 is ensured. The aforementioned only partial metallic coating of the pedestal component 33 can be realized particularly by immersing the assembly only to some extent in a coating electrolyte. In order to ensure good adhesion between the metallic coating 10 and the pedestal component 33, it is possible to use or produce a pedestal component 33 with corresponding structures, for example puncture-like structures, resulting in an interlocking of coating 10 and pedestal component 33.

As mentioned before, it is advantageous if the pedestal component 33 is produced by means of the additive manufacturing process, particularly by microlaser sintering of metallic powder materials, on the electric contact surface 32. This results in a good connection between pedestal component 33 and contact surface 32 which not only acts mechanically but also constitutes an electric transition. In this case, particularly the aforementioned technology of microlaser sintering is promising because a material mixing (fusing) of the two different component materials is realized.

Figure 15:
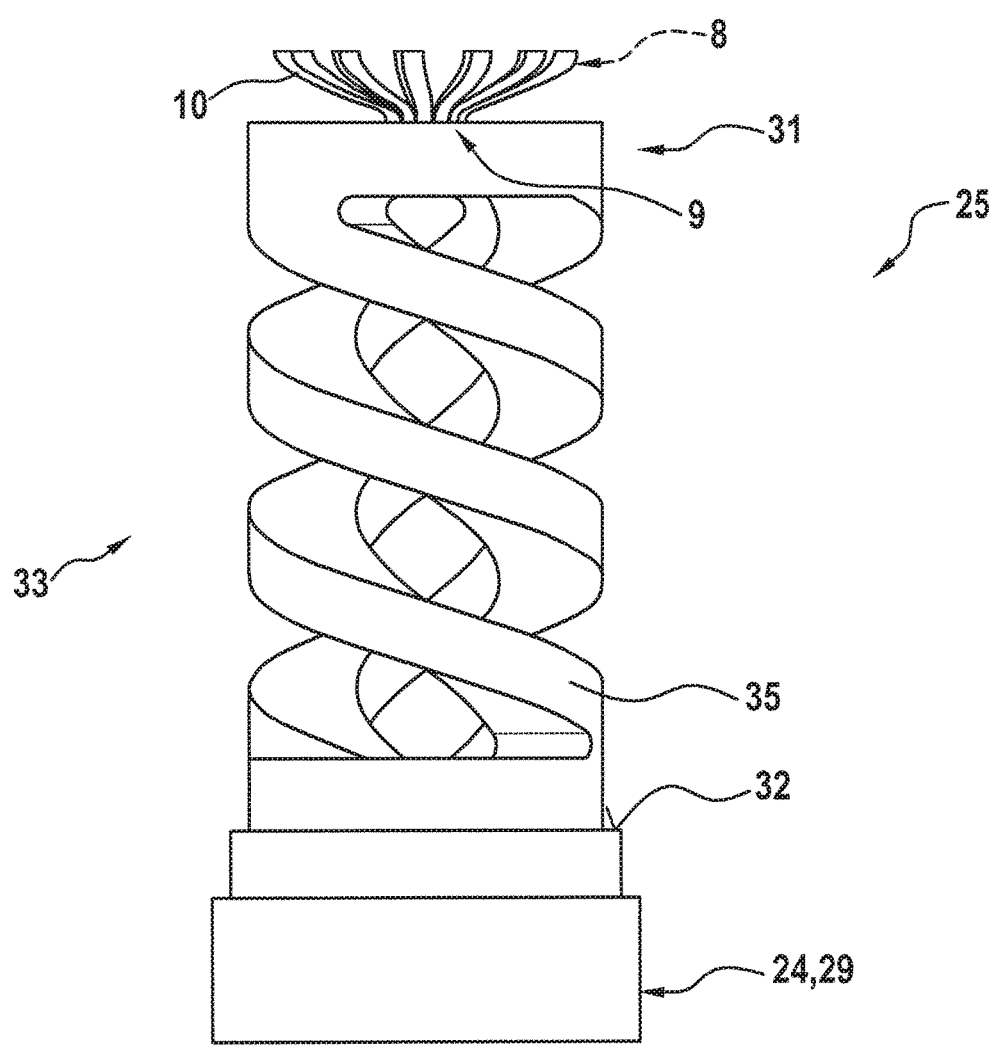
FIG. 15 shows a further embodiment of a spring contact pin with contact surface and connecting part.

FIG. 15 shows a further embodiment of a spring contact pin arrangement 25. The design corresponds to the design of FIG. 14, but the pedestal component 33 is provided/produced with at least one elastic structure 35 which—in addition to the spring contact pin 9—allows for an additional axially elastic deformability, ensuring good contact. With regard to the pedestal component 33 of FIG. 15, reference is correspondingly made to the previous descriptions for the pedestal component 33 of FIGS. 13 and 14. The spring contact pin 9 of FIG. 15 substantially consists of a head-like spring structure which is produced using the method according to the invention, i.e. at first, the base part 8 made of plastic is produced particularly on the pedestal component 33, followed by the metallic coating, particularly on the base part 8 and preferably to a certain extent on the pedestal component 33.

Figure 16:
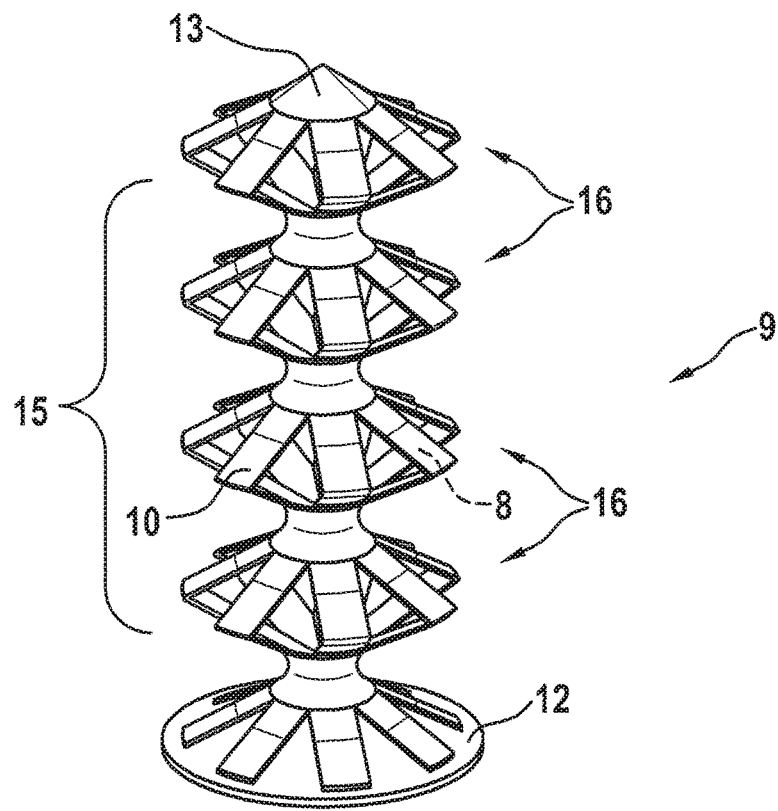
FIG. 16 shows a further embodiment of a spring contact pin.

FIG. 16 shows a further embodiment of a spring contact pin 9 which was produced using the method according to the invention. In order to achieve the spring effect of the spring contact pin 9, a plurality of spring elements 16 are series-connected and act in a disc spring-like manner, wherein the spring element 16 on the side of the head simultaneously forms the tip 14.

Figure 17:
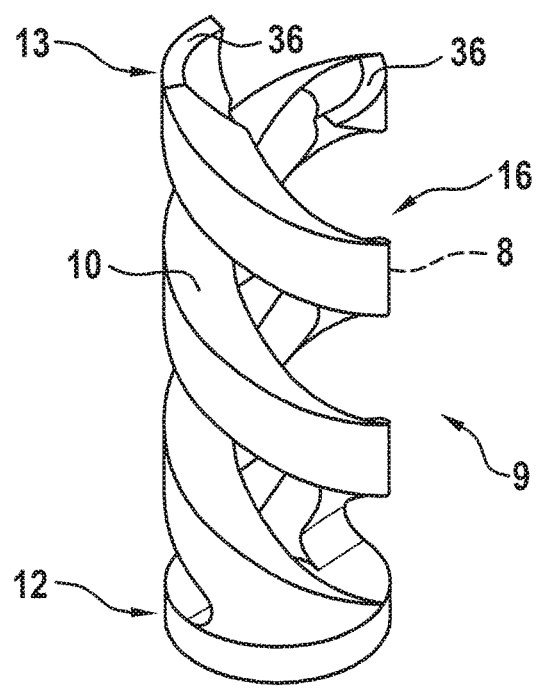
FIG. 17 shows a further embodiment of a spring contact pin.

FIG. 17 shows a further embodiment of a spring contact pin 9 which was produced using the method according to the invention. The spring contact pin 9 of FIG. 17 consists particularly of two coils wound around each other. The head providing the contact is formed by arch-shaped surfaces 36.

Figure 18:
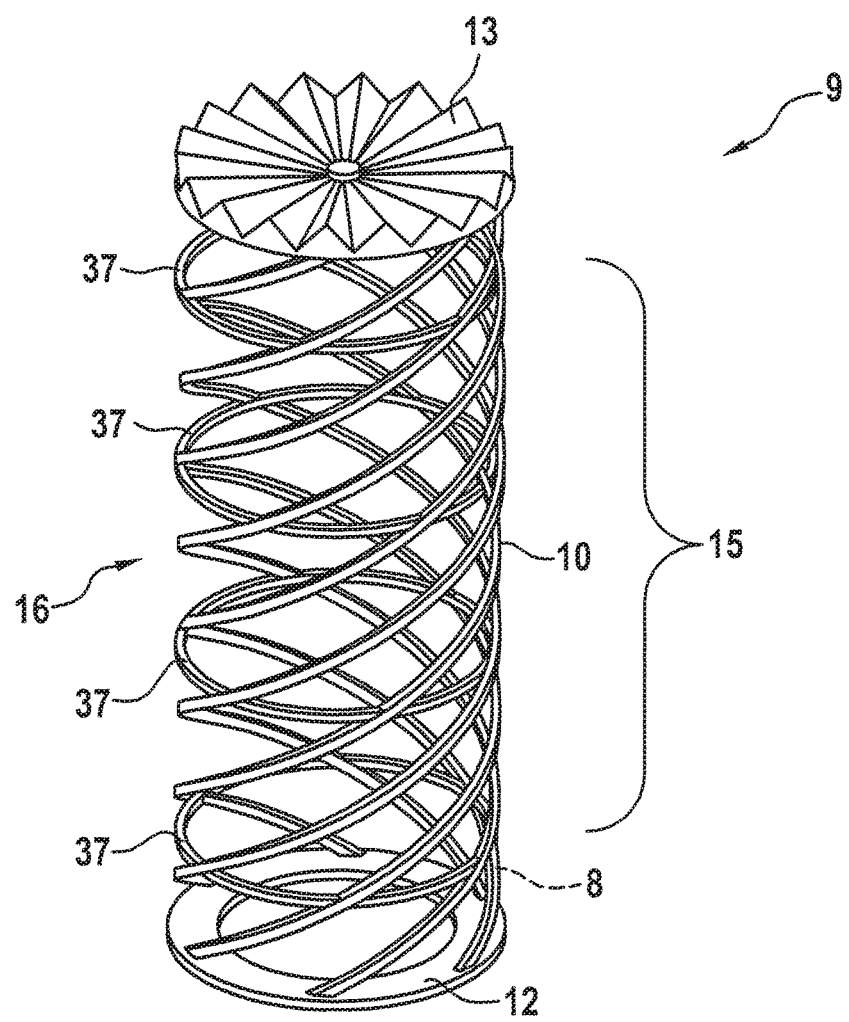
FIG. 18 shows a further embodiment of a spring contact pin.
Figure 19:
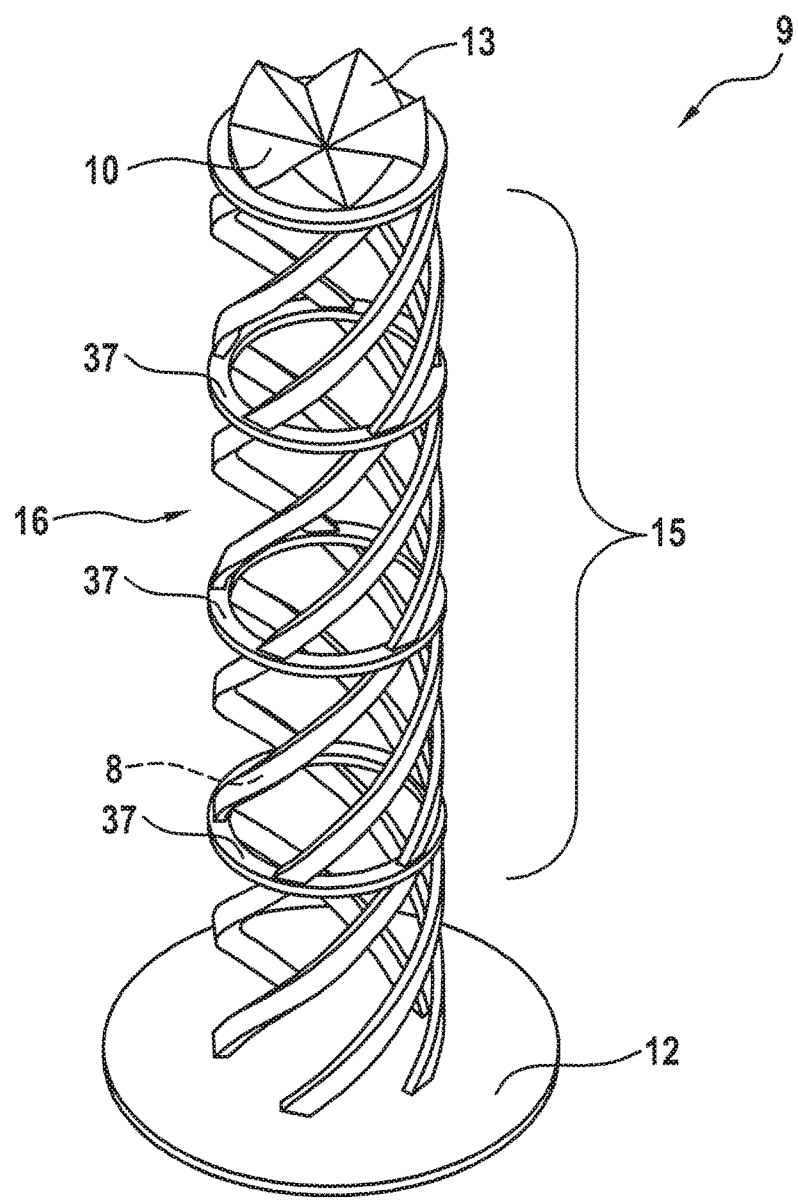
FIG. 19 shows a further embodiment of a spring contact pin.

FIGS. 18 and 19 show further spring contact pins 9 which were produced using the method according to the invention, wherein the elastic area 15 is formed by a multicoil. For stabilization purposes, the multicoil comprises support rings 37 which lie spaced apart from one another. Each of the heads 12 is realized by means of a tooth rosette. Due to the multicoil, a torque develops during the deflection of the structure, resulting in deliberate slight "damage" of the contact partner and thus optimal contact results.

Figure 20:
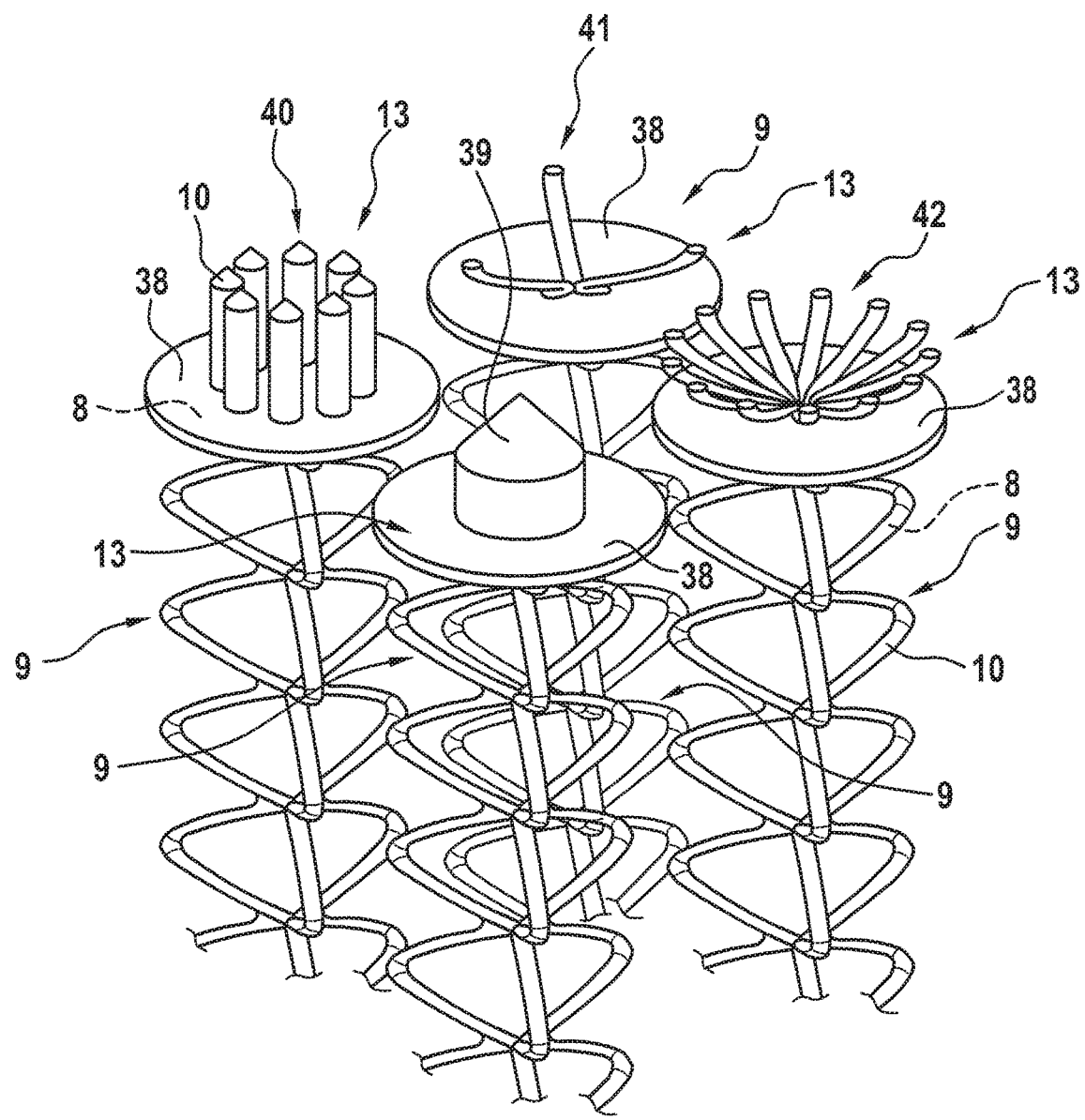
FIG. 20 shows different embodiments of heads of spring contact pins.

FIG. 20 shows a further embodiment of spring contact pins 9, having different head structures. These spring contact pins 9 are once again produced using the method according to the invention. Each head comprises a disc 38, on which a single tip 39, multiple tips 40, a three-finger contour 41, or a multi-finger contour 42 (more than three fingers) is formed.

Figure 21:
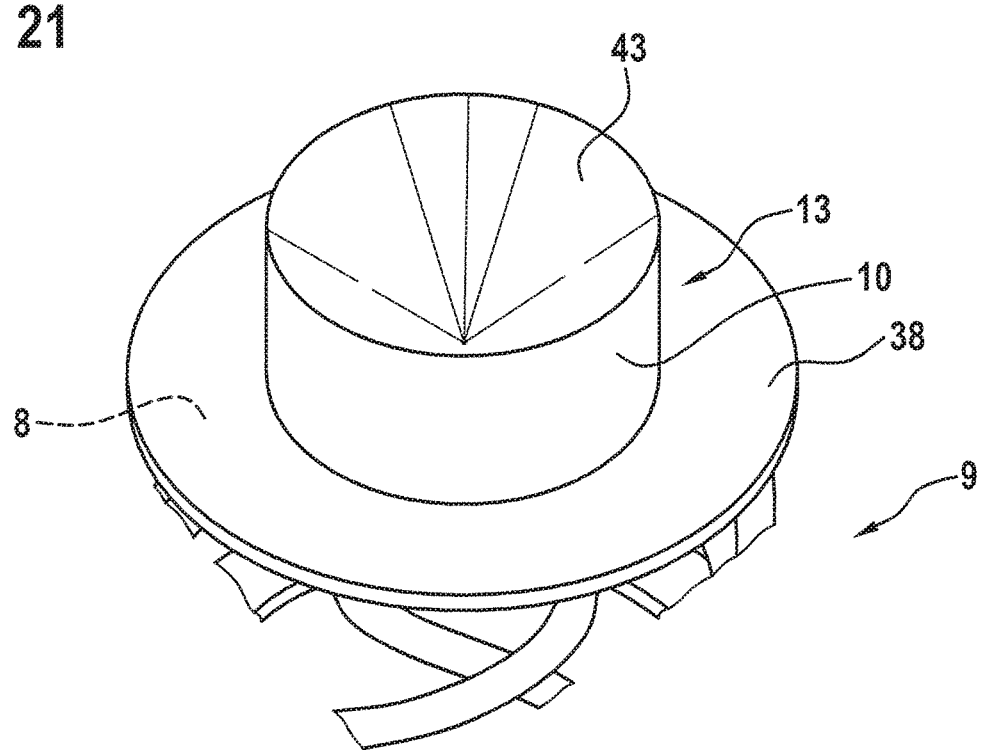
FIG. 21 shows an embodiment of a head of a spring contact pin.
Figure 22:
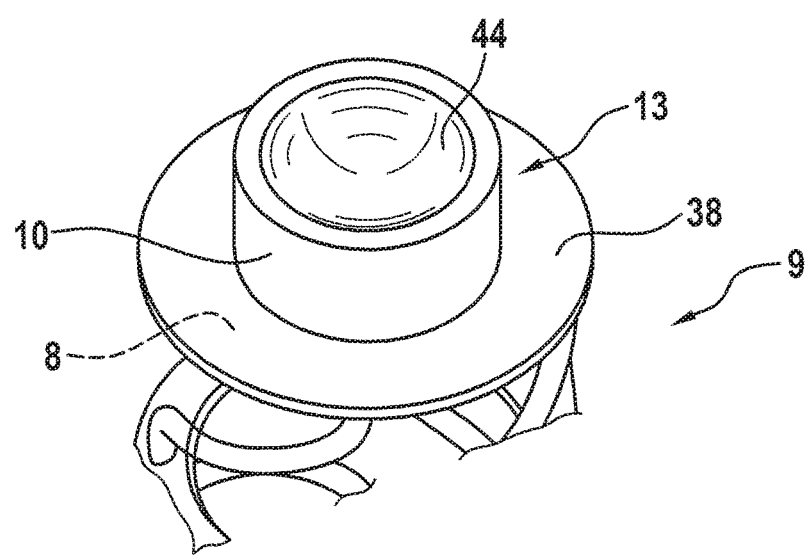
FIG. 22 shows a further embodiment of a head of a spring contact pin.

FIGS. 21 and 22 show two heads 12 which optionally each comprise a disc 38, on which a conical structure 43 (FIG. 21) having a sharp edge, or a concave semispherical structure 44 is formed. The spring contact pins 9 of FIGS. 21 and 22 can each have a further protrusion, particularly a disc or the like in each of the end portions (not depicted). It is thus possible to arrange the spring contact pin between two guide plates, as already described for the embodiment of FIG. 7, wherein the two discs or the like are supported by the inner sides of the two guide plates.

Figure 23:
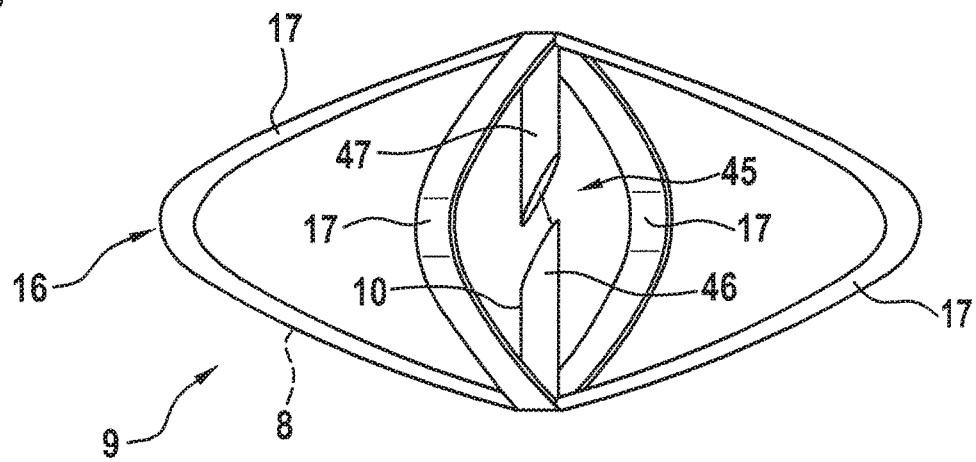
FIG. 23 shows a spring contact pin or a section of a spring contact pin with switching contact, shown in an unswitched state.
Figure 24:
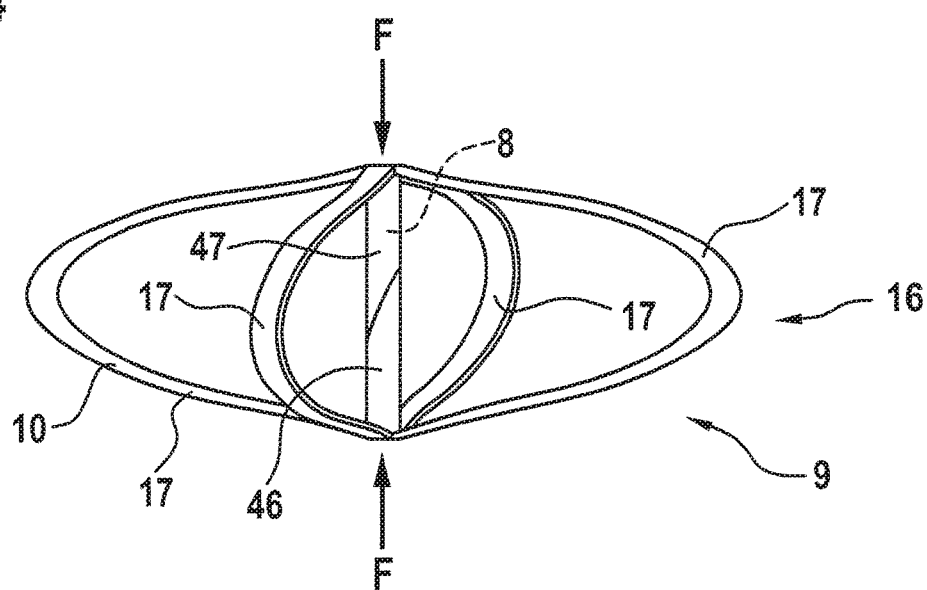
FIG. 24 shows the arrangement of FIG. 23 in its switched state.
Figure 25:
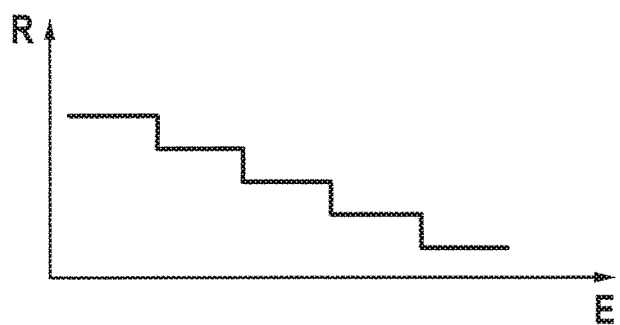
FIG. 25 shows a diagram regarding the arrangement of FIGS. 23 and 24.

FIGS. 23 to 25 show a spring contact pin 9 or a section of a spring contact pin 9, each produced using the method according to the invention. The arrangement is selected such that in case of an axial load (forces F in FIG. 24), a switching contact 45 (interrupted center shaft) is closed (comparison of FIGS. 23 and 24). The switching contact 45 is closed, when the spring contact pin 9 makes electric contact with a test object or the like. The spring structures (arms 17) shown in FIGS. 23 and 24 are metallized and are thus electrically conductive. When the switching contact 45 is closed by moving two opposite contact structure 46 and 47 of the center shaft together, the electric resistance of the arrangement is lowered, i.e. it results in a step in the characteristic, as can be seen in FIG. 25. It shows the electric resistance R over the press-in depth E, i.e. over the travel of the axial pressing together of the spring contact pin 9. If the spring contact pin 9 consists of a plurality of such structures according to FIG. 23, which are series-connected to one another, and if the contact structures 46 and 47 of the individual series-connected elements have distances of different sizes (in the non-contact state), it results in the diagram of FIG. 25, i.e. the more the press-in depth increases, the more switching contacts 45 are closed, and as a result, one step appears each time in the depicted characteristic.

Figure 26:
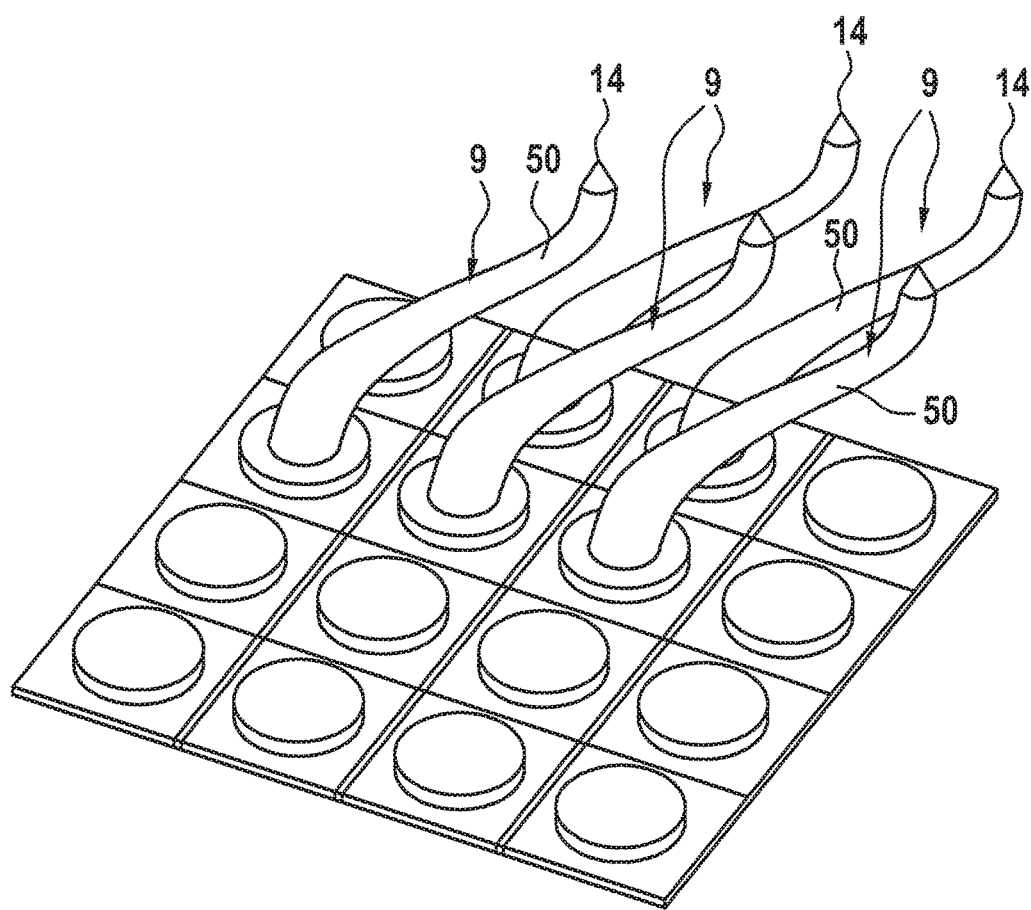
FIG. 26 shows an embodiment different from FIG. 9, having a plurality of spring contact pins and a connecting part.

FIG. 26 shows a further embodiment which is comparable to the embodiment described for FIG. 9, and so in the following only the differences of the embodiment of FIG. 26 when compared to the embodiment of FIG. 9 will be described. Basically, it must first be noted that the spring contact pins 9 of FIG. 26 are not designed so as to be axially elastic along their center axis but instead work according to the so-called cantilever principle, i.e. they comprise laterally protruding areas 50 and are elastic due to these areas 50. It is particularly provided that the spring contact pins 9 have an S-shaped profile along their length. It can be provided that the diameter of each spring contact pin 9 tapers in the direction of the tip 14. Once again, each contact pin 9 comprises a base part 8 which is provided with a metallic coating 10. For that purpose, the additive manufacturing process is preferably used.

The spring contact pins 9 of all embodiments according to the invention can be used solely for contacting a test object contact, or it is also possible to use a plurality of parallel-connected spring contact pins 9 for one and the same test object contact. As a result, the contact force is increased which can have a positive impact on the electric contact, and the parallel-connected current paths result in a very low-impedance contact.

The invention claimed is:

1. A method for producing at least one spring contact pin acting as an electrical contact, or a spring contact pin arrangement including at least one such spring contact pin, the method comprising:
    producing at least one base part of the spring contact pin, wherein at least a section of the base part is made of plastic; and
    subsequent metallizing of at least the section of the base part that is made of plastic;
    wherein the at least the section of the base part that is made of plastic is produced by an additive manufacturing process;
    wherein the at least one spring contact pin is additively built on an electric contact surface of a connecting part which is designed as an electric circuit carrier, the electric circuit carrier being a circuit board; and
    wherein at least a portion of the plastic base part is selectively removed by wet or dry chemical process or a pyrolysis method.

2. The method according to claim 1, wherein a two-photon laser lithography, particularly a dip-in laser lithography method is used as additive manufacturing process.

3. The method according to claim 1, wherein the metallizing takes place in at least one of galvanic and chemical process.

4. The method according to claim 1, wherein an entirety of the base part is made of plastic, by the additive manufacturing process, as a one-piece base part.

5. The method according to claim 1, wherein an entirety of the base part is metallized.

6. The method according to claim 1, wherein prior to the galvanic metallizing, an electrically conducting starting layer is applied at least to the section of the base part that is made of plastic, or is produced on the surface of the section.

7. The method according to claim 1, wherein prior to metallizing, a seed layer is applied, by a dipping or plasma process, at least to the section of the base part that is made of plastic, or is produced on the surface of the section.

8. The method according to claim 1, wherein at least one opening is created or left in the metal sleeve formed by metallizing, the opening being used for one or more of (i) pyrolysis products to escape and (ii) providing access of at least one of wet chemical and dry chemical agent for respectively executing the wet chemical and dry chemical process.

9. The method according to claim 1, wherein for a spring function of the spring contact pin, at least one area of the spring contact pin is designed elastically resilient due to one or more of inherent elasticity and the design of its material.

10. The method according to claim 9, wherein the at least one area is integral with a remaining section of the spring contact pin.

11. The method according to claim 9, wherein the at least one area is produced by forming at least one pressure, tension, bending or torsion spring; or as a resilient area according to the buckling-wire principle; or both.

12. The method according to claim 1, wherein at least one head for contacting is formed on the end of the spring contact pin, the at least one head having preferably at least one of sharp tip and sharp edge for contacting.

13. The method according to claim 1, wherein a plurality of spring contact pins in a two or three-dimensional grid are produced connectedly by the at least one connecting part.

14. The method according to claim 1, wherein the connecting part is produced or jointly produced by the additive manufacturing process.

15. The method according to claim 1, wherein the electric contact surface is also metallized.

16. The method according to claim 1, wherein a metallizing present between at least two spring contact pins for an electric insulation of the two spring contact pins to one another is removed, by at least one of a laser, focusing ion beam and masking as well as by etching.

17. The method according to claim 1, wherein a pedestal component made of electrically conducting material, is produced on/attached to the contact surface of the connecting part, and that the spring contact pin is produced on the pedestal component, wherein metallizing is extended to an area of the pedestal component adjacent to the base part but is not extended to the contact surface.

18. The method according to claim 1, wherein the pedestal component is produced by the additive manufacturing process, particularly by sintering, preferably laser sintering, of powder materials.

19. The method according to claim 1, wherein the pedestal component is produced on the contact surface and particularly electrically connective with the contact surface.

20. The method according to claim 1, wherein the pedestal component is produced with at least one elastic structure including an elastic area of the particularly one-piece pedestal component such that the spring effect acts in the direction of the contact.

21. A spring contact pin or spring contact pin arrangement having at least one spring contact pin, each produced using the method according to claim 1.

* * * * *